United States Patent [19]

Nelson

[11] Patent Number: 4,777,513
[45] Date of Patent: Oct. 11, 1988

[54] WEB TRANSPORT SYSTEM

[75] Inventor: Erik K. Nelson, Centerville, Ohio

[73] Assignee: The Mead Corporation, Dayton, Ohio

[21] Appl. No.: 106,284

[22] Filed: Oct. 9, 1987

[51] Int. Cl.$^4$ .................. G03B 27/32; G03B 27/52
[52] U.S. Cl. ..................................... 355/27; 226/118; 352/184
[58] Field of Search .................. 355/27, 28; 226/108, 226/118; 352/184, 185, 186

[56] References Cited

U.S. PATENT DOCUMENTS 3,007,368  11/1961  Rosenblum ................ 352/184
3,515,327   6/1970  Bortmas .
4,110,758   8/1978  Nelson et al. .
4,165,666   8/1979  Johnson .

Primary Examiner—Monroe H. Hayes
Attorney, Agent, or Firm—Biebel, French & Nauman

[57] ABSTRACT

A web transport and metering system provides the continuous delivery of a web to a developer while providing intermittent delivery of the web to an exposure station. An exposure station is defined between a pair of spaced-apart rolls, and a supply of web material leads to the exposure station over a loop-forming roller carried on a movable carriage or truck. A second loop-forming roller on the carriage receives the web from the second roll of the exposure station and delivers the web to a continuously running developer. The carriage is movable on guides or tracks parallel to the plane of the exposure station between first and second positions, which positions are defined by limit switches which operate a controllable brake on one of the exposure station rolls to interrupt movement of the web at the exposure station. During such interrupted movement, the developer draws web material from the second loop, and the movement of the carriage pulls web material into the first loop. A tension or return spring on the carriage causes the carriage to return to its first movement, when the brake at the exposure station is released, thereby causing translation of the web material through the exposure station and out of the first loop into the second loop. A tension drag or brake on the supply roll assures a desired tension in the web throughout the loops, and permits continuous feed through the loops to the continuous developer, when the exposure station brake is released. The invention further includes a means of reversing the system to reduce the material usage on single exposure runs.

8 Claims, 3 Drawing Sheets

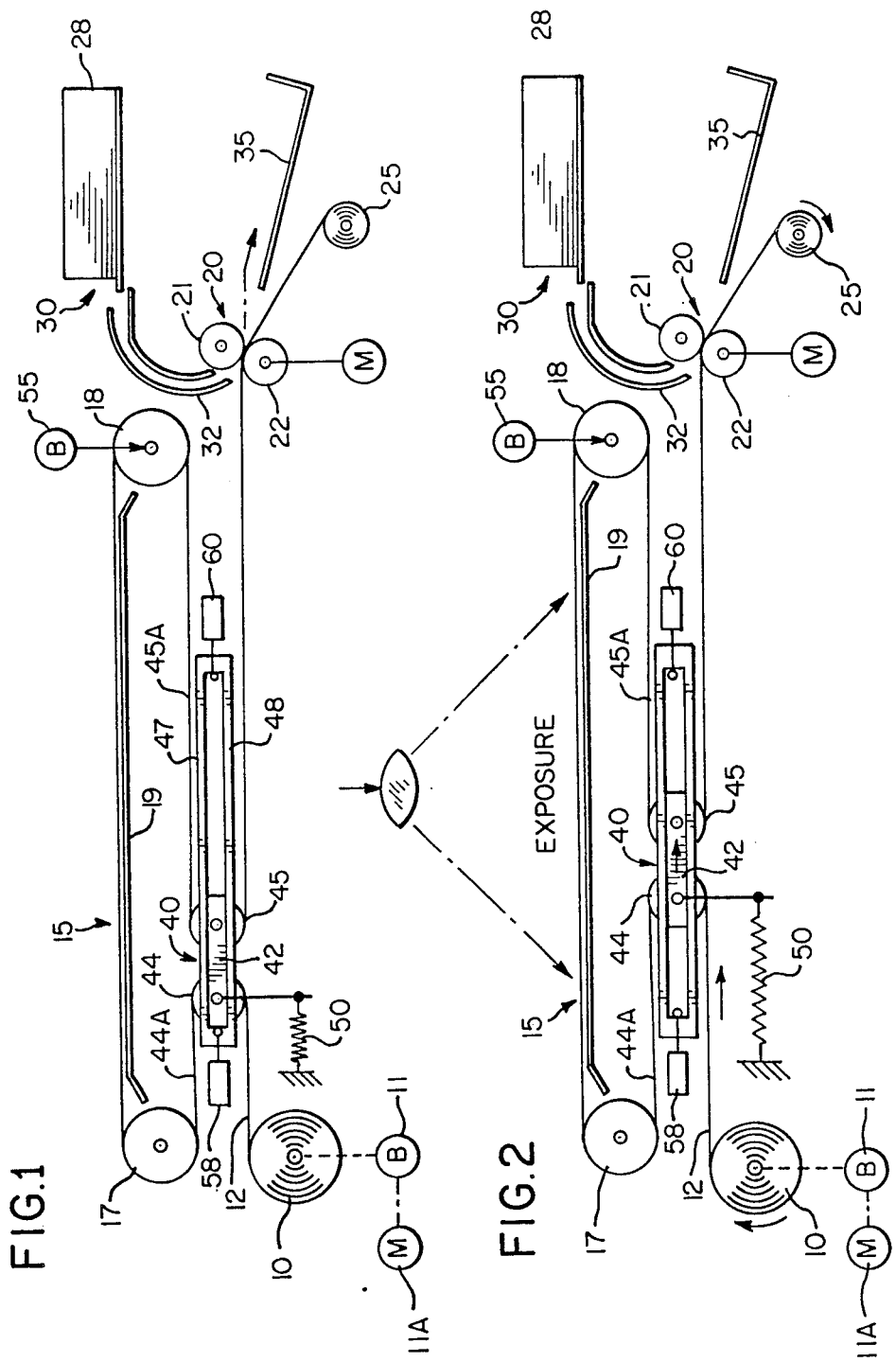

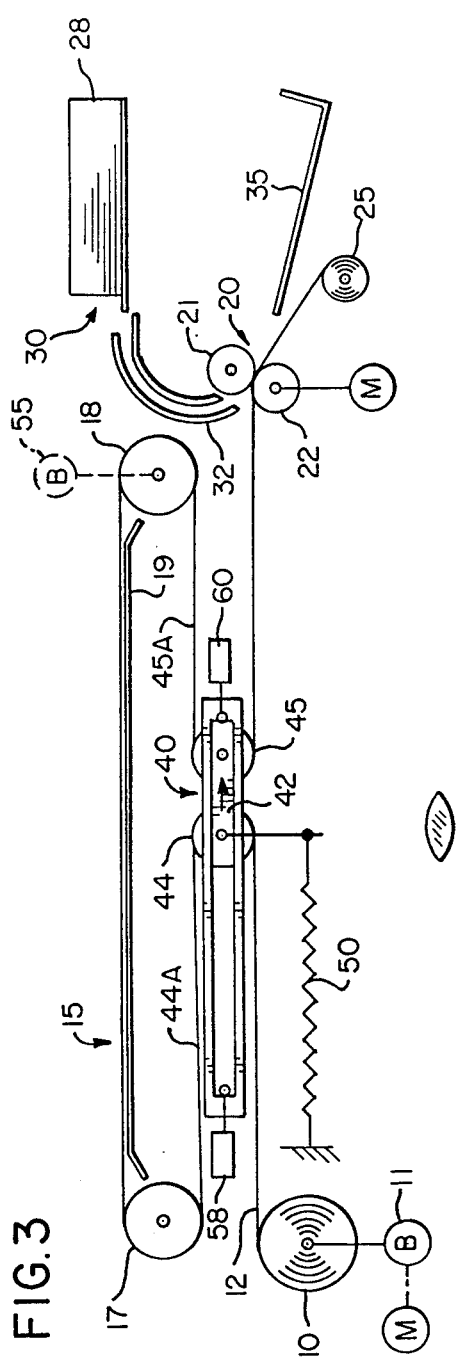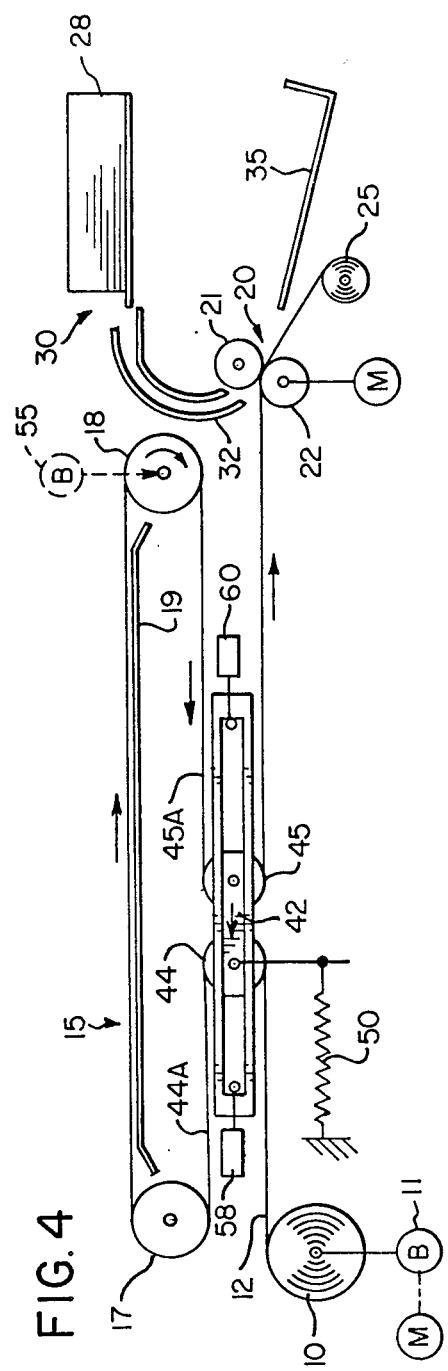

WEB TRANSPORT SYSTEM

BACKGROUND OF THE INVENTION

This invention is related to a web transport system, and more particularly to a system which delivers a web by intermittent motion to an exposure station, while providing for continuous motion of the web through a developer station.

In certain media processes it is desirable to move a web of material in predetermined increments past a first station, such as an exposure station, where a latent image may be formed on the media or on the web which supports the media. The web containing the latent image is then processed at a second station, such as a developer, which continuously acts upon the web. In such an automated web delivery system, it is necessary to supply the web to the continuous developer without interruption, while providing for intermittent delivery of the same web to the exposure station, followed by dwell of the web at the station for exposure, accompanied by translation of the material for movement to the developer station.

The invention is particularly useful in handling media or web material which has been made in accordance with the systems and teachings of U.S. Pat. Nos. 4,440,846 and 4,339,209, each assigned to the same assignee as this invention and incorporated herein by reference. In such systems, an imaging system includes a photosensitive layer on a donor web comprising microcapsules which contain a photosensitive composition in the internal phase. The image material is exposed to actinic radiation to form a latent image. Thereafter, the material is subject to a uniform rupturing force in a developer whereupon the microcapsules rupture and imagewise release the internal phase. The rupturing force may be applied by a roll-type pressure developer, which forms a force-applying and driving nip between a pair of pressure rolls. These rolls apply a uniform pressure across the width of the web or the sheet material which contains the latent image.

The imaging systems as described in the above-identified U.S. patents are particularly advantageous since they are totally dry systems and do not rely upon the application of wet developing process solutions to produce or develop the image. An image-forming chromogenic material, such as a substantially colorless color former, is typically associated with the microcapsules.

When the microcapsules rupture, a color former image-wise reacts with the developer material and produces a color image. In the embodiments described in these patents, the microcapsules are typically ruptured by passing the exposed imaging webs or sheets through the nip between pressure or calender rolls. The total media may exist in either single sheet or two sheet versions. In the former, the microcapsules and developer composition are both coated onto a single substrate layer or web. In the latter, the microcapsules are carried on a first substrate layer, referred to as a donor sheet or web. The developer composition is coated on a separate second substrate layer, referred to as a receiver sheet. The donor web is subject to actinic radiation, at an exposure station, and the exposed microcapsule layer is brought into contact with the developer layer of the receiver sheet, and the two sheets are then developed together by the application of pressure thereto, by the roll-type developer, with the finished image being formed on the receiver sheet.

It is desirable that the web containing the media be brought into an exposure station and the movement interrupted during exposure. It is also desirable that the latent image be delivered to the pressure roll developer in a continuous state, that is, without linear interruption, since stopping and starting of the developer can cause variations in image density, image quality, and the like. In addition, the starting and stopping can place heavy loads on the bearings and on the drive components due to the high inertial loads and heavy loading pressures involved. Thus, it is desirable that the developer rolls turn continuously during processing of the media.

As a result, it is necessary to provide a supply of web material for the developer while web movement is interrupted at the exposure station. A simplified transport system is required, which provides the necessary storage of web material for the developer, and at the same time defines and provides the required advancement of the web material to the exposure station, followed by the interruption of movement of the web material for exposure, the transport of such image for development, and the positioning of unexposed media at the exposure station. It is also desirable to avoid rapid acceleration of the supply roll in any delivery system since the shearing forces involved could damage the media surface.

SUMMARY OF THE INVENTION

A web transport and metering system is disclosed which provides intermittent delivery of a web to an exposure station, and which also provides for the continuous delivery of such web from the exposure station to a developer, such as a continuous roll-type developer. The web material is brought from a supply, which may be a roll or cartridge of such material. The web forms a loop over one of a pair of loop-forming rollers or the like on a transport or carriage apparatus, and from this loop-forming device the web passes to the first of a pair of spaced-apart rolls which define an exposure station therebetween. The web continues from the second of the pair of rolls in a loop over the second loop-forming device on the transport, and from there to the nip defined by pressure rolls in a continuous pressure developer.

The exposure station is preferably in a plane, and the transport is preferably mounted for reciprocal movement parallel to the plane of the exposure station. The transport, carrying the pair of rollers which define the first loop between the supply and the first exposure station roller and the second loop between the second exposure station roller and the developer, is preferably mounted for movement parallel to the exposure station plane. The transport itself is biased or otherwise moved into a first position in which the first loop is at its minimum size and the second loop is at its maximum size. The transport moves to a second position in which the first loop is at its maximum size and the second loop is at its minimum size. The transport is moved by tension in the web exerted by the continuous developer station, and such movement from its first to its second position, as defined above, serves to draw the web from the supply into the first loop while, simultaneously, delivering material from the second loop to the developer. The acceleration on the supply roll is at a low rate, thereby reducing shear loading on the web. During the time that the transport is caused to move from the first and second position, the web between the first and second rolls of the exposure station remains stationary. This is assured by applying a braking force or a snubbing force to the web at the exposure station, which may conveniently and advantageously take the form of a controllable brake on the second of the two exposure station rolls.

Thus, when the movement of the web containing the media is interrupted, such as by the application of the brake to the second roller, the continued delivery of the web material to the roll-type developer results in the movement of the transport from its first or rest position toward its second position, thereby withdrawing web from the supply and providing web to the developer. During this period of time, the web at the exposure station remains stationary and may be exposed in the conventional manner.

When the transport has reached the second position, which position may be detected by a suitable detector, such as a limit switch, the brake which has prevented the movement of the web at the exposure station may be released. The transport may now be returned to its rest or its first position. Since the total amount of web material between the supply and the developer remains constant, the return movement of the transport, which may be under the influence of a tension spring or the like, is accompanied by a corresponding translation of the web material through the exposure station, as the first loop is diminished in size accompanied by a corresponding lengthening of the second loop. Also, during return of the transport to its first position, the developer may continue to draw the web from the supply and through the loops.

Where a separate receiver media sheet material is used, a sheet feeder may be employed in combination with the developer for the purpose of delivering, in timed sequence, receiver media sheets for processing with the donor web as it is drawn through the developer.

The apparatus of this invention may also advantageously be used in conditions where only a single exposure, at a time, is made, and developed, with the unused portion of the web returned to the supply following such single exposure. For this purpose, the apparatus may be operated in a reverse mode to return a measured portion of the unused web to the supply or alternatively, known means for identifying the location of the leading edge of the exposed portion may be applied to the web at the exposure station for downstream detection of the position of the exposed portion of the web. Following exposure, the unused portion of the web from the supply may be returned to the supply, either by releasing the web at the pressure developer rolls or reversing the direction of these rolls, accompanied by the application of a positive rewinding force at the web supply to draw back into the supply an amount of material corresponding to the excess of the unused portion of the web, such that once the system is set up and operating, only so much of the web as is necessary for a single exposure is expended.

It is accordingly an important object of this invention to provide a web delivery system which provides for intermittent movement of a web at an exposure station accompanied by continuous movement of the web from the exposure station to a developer. A particular advantage of this system is that it permits simultaneous exposure and development, thus shortening the overall cycle time.

A further object of the invention is the provision of a loop forming reciprocating transport system, by which a web is intermittently transported through an exposure station and by which it is continuously supplied to a developer station.

Another object of the invention is the provision of a web delivery system including a translational carriage or transport, forming loops in the web and movable in parallel relation to a fixed station on the web, in which the total amount of material in the loops remain constant, while providing for lengthening of one of the two loops accompanied by shortening of the other, to permit delivery of web material in an uninterrupted manner with one direction of movement of the transport, and to provide for the shifting of the web material through the fixed station with return movement of the transport.

A further object of the invention is the provision of a web transport and metering system for the intermittent delivery of web material to an exposure station while providing for the continuous delivery of such material from the exposure station to a continuously running developer, in which a loop-forming transport is mounted for translational movement to pull material from a web source and to deliver material to the developer when a brake or restraining force is applied to the web material at an exposure station, accompanied by the return of the transport to its first position when it is desired to advance the position of the web material in relation to the exposure station.

A still further object of the invention is the provision a delivery system for transporting media containing web material to an exposure station, providing for economy in the single exposure of a portion of the web material by returning the unexposed or unused portion back to the supply following the development of the exposed portion.

These and other objects and advantages of the invention will be apparent from the following description, the accompanying drawings, and the appended claims.

BRIEF DESCRIPTION OF THE DRAWINGS

FIG. 1 is a diagrammatic elevational view of the web transport system of this invention;

FIG. 2 is a view similar to FIG. 1 showing the transport in a partially moved position;

FIG. 3 is a view of the system of FIG. 1 showing the transport in its moved or second position;

FIG. 4 is a view of the system of FIG. 1 showing the return movement of the transport from its second to its first position;

DESCRIPTION OF PREFERRED EMBODIMENT

Figure 5:
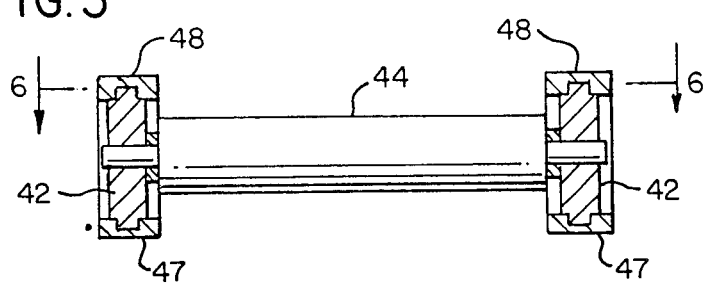
FIG. 5 is a transverse sectional view through the transport and transport guides.

Referring to the figures of the drawings, which illustrate a preferred embodiment of the invention, a supply 10 of media bearing web material may consist of a roll of such material, or which may, if desired, be provided in cartridge form. A friction or drag brake 11 controls the movement of material from the supply 10, and may be integral with or internal to the roll, such as part of a cartridge, or may be separate from the roll. The brake 11, in an embodiment which does not provide for reversing of the web material or retraction of the material into the roll 10, may be a simple friction or drag brake.

Where the transport system has the capability of retrieving material by rewinding the same into the supply 10, the brake 11 may advantageously be a motor brake. The supply 10 provides a continuous web 12 to an exposure station illustrated generally at 15. The exposure station 15 is defined between a first web turning roll 17 and a second transversely spaced web turning roll 18, with a portion of the web 12 extending in a plane therebetween over a support 19.

The web transport and metering system further provides for the delivery of the web 12 to a continuously operating pressure developer illustrated generally at 20. The developer 20 includes at least a first pressure roll 21 and a second pressure roll 22 which forms a nip therebetween through which the web material is continuously drawn to a take-up spool 25. Thus, the developer may be made in accordance with the teachings of the copending application of Stone et al, U.S. Ser. No. 009,851 filed Feb. 2, 1987, and assigned to the same assignee as this invention, which disclosure is incorporated herein by reference. When separate receiver media sheets 28 are employed, they may be delivered by a sheet delivery system indicated generally at 30, through a chute 32 for feeding into the rolls 21 and 22 of the developer 20 in timed relation to latent images on the web 12 as applied at the exposure station 15. The receiver sheets may be stored, after development, in a suitable bin 35 downstream of the developer 20.

Figure 6:
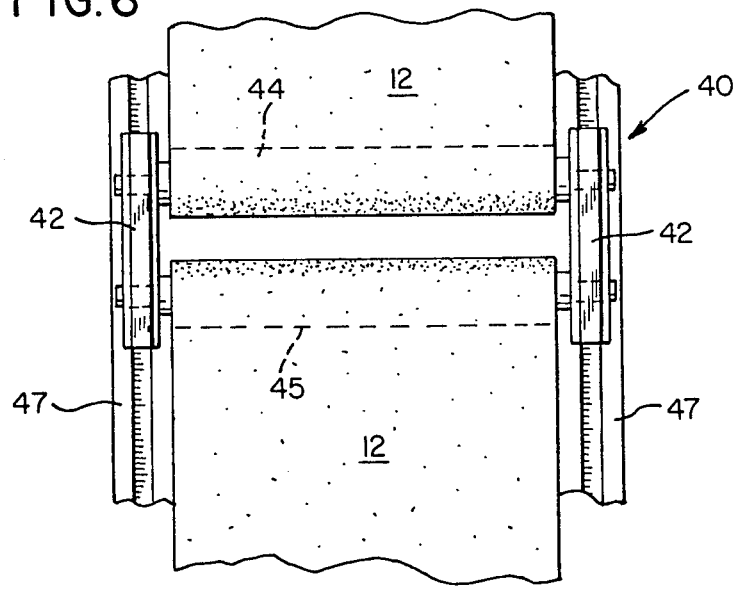
FIG. 6 is a fragmentary plan view of the web transport and transport guides looking generally along the line 6—6 of FIG. 5.

The web transport and metering system of this invention includes a loop-forming carriage or transport illustrated generally at 40 in FIGS. 1 and 2. The transport 40 includes a truck or carriage 42 on which is mounted a pair of freely turning rollers, including a first roller 44 and a second roller 45. The truck 42 itself is mounted for translational movement between pairs of generally parallel guideways 47 and 48, as best shown in FIGS. 5 and 6. The path defined by the guideway pairs is preferably parallel to the path of movement of the web in the plane of the exposure station 15.

The truck or carriage 42 of the transport 40 is movable on the guideways 47 and 48 from a first or rest position, as shown in FIG. 1, to a second or moved position as shown in FIG. 3, and may be spring-biased by a tension spring 50 to the rest position. The first roller 44 of the transport 40 forms a first loop 44a in the web 12, between the supply roll 10 and the roll 17. The second roller 45 forms a second loop 45a in the web 12 between the roll 18 of the station 15 and the developer 20. Since the loop-forming rollers 44 and 45 are relatively joined or fixed in relation to each other by the truck 42 of the transport 40, the amount or length of material between the supply roll 10 and the developer 20 does not change, regardless of the position of the transport. Also, the sum of the material in the respective loops 44a and 45a is constant.

In order to interrupt the movement of the web 12 at the exposure station 15, means is provided for snubbing or interrupting the movement of the web 12 in the exposure station. For this purpose, the second roll 18 may be provided with an electrically operated releasable brake 55 which, when energized, stops the rotation of the roll 18, thereby interrupting the movement of the web 12 at the exposure station 15 as long as the brake is applied. The position of the transport 40 at the rest or first position, as shown in FIG. 1, may be detected by a limit switch 58, and the arrival of the transport 40 to the moved or second position of FIG. 3 may be detected by an adjustable limit switch 60, to control the operation of the brake 55.

It is also desirable to provide roll 18 with a covering of high friction matrial, such as rubber.

It is preferred that all of the rolls be of a low inertia construction, such as thin-walled, Teflon coating tubing, so as to introduce a minimum of inertia and friction into the system. While low inertia rolls should be used throughout, it is particularly important that the rolls 44 and 45 be of such lightweight construction.

The operation of the invention as described above is largely self-evident from the foregoing description. It will be understood that the rolls 21 and 22 of the developer 20 are normally continuously turning in any cycle of operation. The developer pulls the web 12 through the rolls, for accumulation on the spool roll 25. When the shaft brake 55 is released, the spring 50 will return the transport 40 to the home or rest position as shown in FIG. 1, and the limit switch 58 will be contacted. This switch may be connected to a suitable power source and control relay, to operate the brake 55, after a short delay which may be in the order of ½ second, in order to equalize tension in the web. An exposure at the exposure station 15 may now be made, and while the exposure is being made, the rolls of the developer 20 continue to turn.

The developer 20 draws the web 12 therethrough, as well as the receiver sheets 28, and the web begins to pull the carriage 42 in the guideways 47 and 48 from the first position to the moved or second position, as shown in FIG. 2, accompanied by removal of web material from the web loop 45a. Simultaneously, material is withdrawn from the supply or roll 10 into the loop 44a, and the spring 50 is extended. The drag brake 11 on the supply 10 provides tension in the image plane defined at the exposure station 15 and normalizes the torque on the braked roll 18.

When the truck or carriage 42 arrives at the second or moved position, as determined by the position of the limit switch 60, the brake 55 is released and the cycle is permitted to repeat, that is, the carriage 42 is returned to the first or home position by the spring 50, accompanied by a transporting or repositioning of the web through the exposure station 15 to bring new web material in line for exposure and to deliver the exposed material toward the developer 20. This is illustrated in FIG. 4. Any stretch in the web 12 due to the pulling action of the rolls of the developer 20 is automatically taken up and compensated for by this system. Further, during the return movement of the carriage 42, the developer 20 may continue to draw the web from the supply roll 10.

The system of this invention may further be used to reduce inter-document waste on single exposure runs by the expedient of applying a rewind motor 11a, in combination with brake 11 on the supply roll 10, so that the web material 12 may be rewound onto the supply roll, and by reversing the direction of drive of the motor driving the developer 20, or alternatively, releasing the pressure on the rolls 21 and 22, so that the web material may move through the developer 20 from the take-up 25. In one mode of operation, the supply roll 10, as viewed in FIG. 1, may be driven counter-clockwise to take up the web following exposure and development, as previously described, accompanied by reversal of the developer 20, to run spent material from the supply 25 into the loop 45a, and to return a corresponding length of unspent or undeveloped material from the exposure station 15 and through the loop 44a to the roll 10.

An alternative arrangement, utilizing the inherent mesuring capability of the system operates as follows: Starting from the position of the parts as illustrated in FIG. 3, in which the right-hand limit switch is contacted, the brake 55 is reapplied, the supply roll 10 is driven in the counter-clockwise direction, and the developer 20 is reversed. Now, spent web material will be withdrawn from the takeup 25 into the loop 44a as the transport carriage is returned to its first position as shown in FIG. 1, in contact with the limit switch 58. The brake 55 may now be released, and the transport 40 may be returned by any suitable means to the right-hand or second position. It is within the scope of the invention to provide a suitable motive force, such as a motor, to move the transport 40 to its second or right-hand position.

It will therefore be seen that a simple, low cost and effective transport or web delivery system is provided, which supplies intermittent delivery of a web to a first station and at the same time permits the continuous delivery of the web from the first station to a second station. While the carriage preferably moves along a path generally parallel to the path of the web in the first station, defining the exposure station, it will be understood that such parallel movement is not necessarily required, as long as the carriage can move to withdraw web material from the supply and at the same time feed web material into the second station, by increasing the size of the first loop concurrently with a corresponding decrease in size of the second loop. Additionally, while the means for interrupting the movement of the web is described in relation to a brake on the second roll of the developer station, in appropriate circumstances other web-interrupting means may be employed which would permit the continuous or tension feed at the second station to begin translational movement of the carriage in the manner previously described. Further, while the returning or restoring force on the carriage is described in relation to a tension spring, it is obvious that in appropriate circumstances, other means or arrangements may be employed for returning the carriage to the first, rest, or home position to restore the original size to the loops and to effect translational movement of the web through the first station.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. In a web transport and metering system for the intermittent delivery of a web to an exposure station and providing for the continuous delivery of such web from said exposure station to a developer, comprising:
   a supply of web material,
   a first roll,
   a second roll spaced from said first roll and defining said exposure station therebetween,
   a roll-type continuous developer,
   means intermediate said supply and said first roll and intermediate said second roll and said developer, including a carriage,
   means mounting said carriage for movement parallel to the plane of the web in said exposure station,
   first roller means on said carriage receiving said web from said supply and forming a first loop between said supply and said first roll,
   second roller means on said carriage receiving said web from said exposure station and forming a second loop between said second roll and said developer,
   brake means on said second roll for interrupting movement of said web at said exposure station,
   said carriage movable in response to the interruption of movement of said web by said brake means between a first position in which said first loop is small and said second loop is large, to a second position in which said first loop is large and said second loop is small, under the influence of the traction of said developer on said web so as to draw said web from said supply about said first roller means and into said first loop as said web in said second loop between said second roller means and said developer is drawn through said developer,
   means connected to return said carriage to said first position to cause translation of said web over said first and second rolls and through said exposure station when said brake means is released, and
   means sensing the movement of said carriage to said second position to release said brake means.

2. The system of claim 1 further comprising means sensing the arrival of said carriage at said first position to engage said brake.

3. In a web transport and metering system for the intermittent delivery of a web to an exposure station and providing for the continuous delivery of such web from said exposure station to a developer, comprising:
   a supply of web material,
   a first roll,
   a second roll spaced from said first roll and defining said exposure station therebetween,
   a continuous developer applying a traction force to a web,
   transport means intermediate said supply and said first roll and intermediate said second roll and said developer, including a carriage,
   rail means mounting said carriage for movement parallel to the plane of a web in said exposure station,
   a first roller on said carriage receiving said web from said supply between said supply and said first roll and forming a first loop,
   a second roller on said carriage receiving said web from said exposure station between said second roll and said developer and forming a second loop,
   a brake on said second roll for interrupting movement of said web at said exposure station,
   said carriage movable on said rail means between a first position to a second position under the influence of said developer on said web to draw said web from said supply about said first roller into said first loop as said web between said second roller and said developer is drawn from said second loop into said developer when said second roll is braked, and
   means connected to return said carriage to said first position to cause translation of said web over said first and second rolls and through said exposure station when said brake is released.

4. The system of claim 3 in which said last-named means is a tension spring.

5. The system of claim 3 further comprising means sensing the movement of said carriage to said second position to release said brake.

6. The system of claim 5 further comprising means sensing the movement of said carriage to said first position to engage said brake.

7. The system of claim 3 in which said supply of web material comprises a roll of said material, and means for driving said roll of web material in a reverse direction to return said web material to said roll of web material.

8. In a web transport system for the intermittent delivery of a web to a first station and providing for the continuous delivery of such web from the first station to a second station, comprising:

a supply of said web, first web turning means, second. web turning means spaced from said first means and defining said first station therebetween, means applying a traction force to a said web downstream of said second web turning means and defining said second station, transport means intermediate said supply and said first web turning means and intermediate said second web turning means and said second station, including a carriage, means mounting said carriage for movement in a direction generally parallel to the movement of the web between said first and second web turning means, first web engaging means on said carriage receiving said web from said supply between said supply and said first web turning means and forming a first loop, second web-engaging means on said carriage receiving said web between said second web turning means and said second station and forming a second loop, means for interrupting movement of said web at said first station, said carriage movable between a first position to a second position under the influence of said traction force on said web to draw said web from said supply into said first loop as said web is drawn from said second loop by said friction force means when the movement of said web at said first station is interrupted, and means connected to return said carriage to said first position to cause translation of said web over said first and second web turning means and through said first station.

* * * * *